(12) United States Patent
Cai

(10) Patent No.: US 10,446,623 B2
(45) Date of Patent: Oct. 15, 2019

(54) ORGANIC LIGHT EMITTING DISPLAY PANEL AND METHOD FOR FABRICATING THE SAME

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventor: Yu Cai, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/431,788

(22) Filed: Feb. 14, 2017

(65) Prior Publication Data

US 2017/0154935 A1     Jun. 1, 2017

(30) Foreign Application Priority Data

Sep. 20, 2016   (CN) .......................... 2016 1 0835251

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 51/5209* (2013.01); *H01L 51/5225* (2013.01); *H01L 51/5253* (2013.01)

(58) Field of Classification Search
CPC ............. H01L 27/3246; H01L 27/3258; H01L 51/5209; H01L 51/5225; H01L 51/5253
See application file for complete search history.

(56) References Cited

U.S. PATENT DOCUMENTS

| 2005/0140282 | A1* | 6/2005 | Park ...................... H01L 27/322 |
| | | | 313/505 |
| 2007/0046199 | A1 | 3/2007 | Lee et al. |
| 2012/0097927 | A1* | 4/2012 | Shin ..................... H01L 27/3246 |
| | | | 257/40 |
| 2016/0204373 | A1* | 7/2016 | Park .................... H01L 27/3244 |
| | | | 257/40 |
| 2017/0005155 | A1* | 1/2017 | You ..................... H01L 27/3258 |

FOREIGN PATENT DOCUMENTS

| CN | 104485344 A | 4/2015 |
| CN | 105390523 A | 3/2016 |
| CN | 205281089 U | 6/2016 |

\* cited by examiner

*Primary Examiner* — Fernando L Toledo
*Assistant Examiner* — Neil R Prasad
(74) *Attorney, Agent, or Firm* — Kilpatrick Townsend & Stockton LLP

(57) ABSTRACT

An organic light emitting display panel and a method for fabricating the same are provided by the present invention. The organic light emitting display panel includes: a substrate and a light emitting element layer disposed on the substrate. The light emitting element layer is provided with a plurality of first grooves. The organic light emitting display panel also includes an encapsulation layer disposed on the light emitting element layer, the plurality of first grooves are filled with the encapsulation layer.

17 Claims, 30 Drawing Sheets

ORGANIC LIGHT EMITTING DISPLAY PANEL AND METHOD FOR FABRICATING THE SAME

CROSS-REFERENCE TO RELATED APPLICATIONS

This application claims priority to Chinese Patent Application No. 201610835251.0, filed on Sep. 20, 2016 and entitled "Organic Light Emitting Display Panel And Method For Fabricating The Same", the disclosure of which is incorporated herein by reference in its entirety.

TECHNICAL FIELD

Embodiments of the present invention relates to the field of display technologies, in particular to an organic light emitting display panel and a method for fabricating the same.

BACKGROUND

Organic Light-Emitting Diode (OLED) is also referred as an organic electroluminescent device in which light emitting phenomenon would be caused due to injection and recombination of carriers by driving light-emitting material under an electric field. The light-emitting principle of OLED lies in that, under driven by a certain voltage, electrons are injected into an electron transport layer from a cathode, the holes are injected into a hole transport layer from an anode, the electrons and holes are transferred into a light-emitting layer from the electron transport layer and from the hole transport layer, respectively. Then the electrons and holes encounter in the light-emitting layer and generate excitons to excite light-emitting molecules, so that visible lights can be generated through radiating relaxation.

OLED panel is better than Thin Film Transistor-Liquid Crystal Display (TFT-LCD) in picture quality, efficiency, cost, etc. However, the lifetime of the OLED panel generally suffers from surrounding moisture and oxygen and hence is reduced. As a result, the OLED panel requires a good encapsulation in order to be isolated from the around moisture and oxygen.

However, the adhesion force between a thin film encapsulation layer and a light emitting element layer of OLED is week, so that they are easily detached from each other. Such a case will occur especially in a bending process of a flexible OLED, and even crimping and cracking would be caused, which weakens the ability to block moisture, thereby affecting the lifetime and cost of the organic light emitting device.

SUMMARY

The present invention provides an organic light emitting display panel and a method for fabricating the same, for solving a problem that the encapsulation layer and the light emitting element layer of OLED panel are easily detached from each other.

In one aspect, an embodiment of the present invention provides an organic light emitting display panel including:
 a substrate;
 a light emitting element layer disposed on the substrate, the light emitting element layer being provided with a plurality of first grooves; and
 an encapsulation layer disposed on the light emitting element layer, the plurality of first grooves being filled with the encapsulation layer.

In another aspect, an embodiment of the present invention further provides a method for fabricating the organic light emitting display panel. The method includes:
 forming a light emitting element layer on a substrate;
 forming a plurality of first grooves at the light emitting element layer; and
 forming an encapsulation layer on the light emitting element layer, with the plurality of first grooves being filled with the encapsulation layer.

According to the embodiments of the present invention, the light emitting element layer is provided with a plurality of first grooves and the plurality of first grooves are filled with the encapsulation layer that covers the light emitting element layer, so that a pinning structure is formed between the encapsulation layer and the light emitting element layer, thereby increasing the adherence ability between the encapsulation layer and the light emitting element layer and avoiding the detaching of the encapsulation layer from the light emitting element layer in the process of bending.

DETAILED DESCRIPTION

Figure 1A:
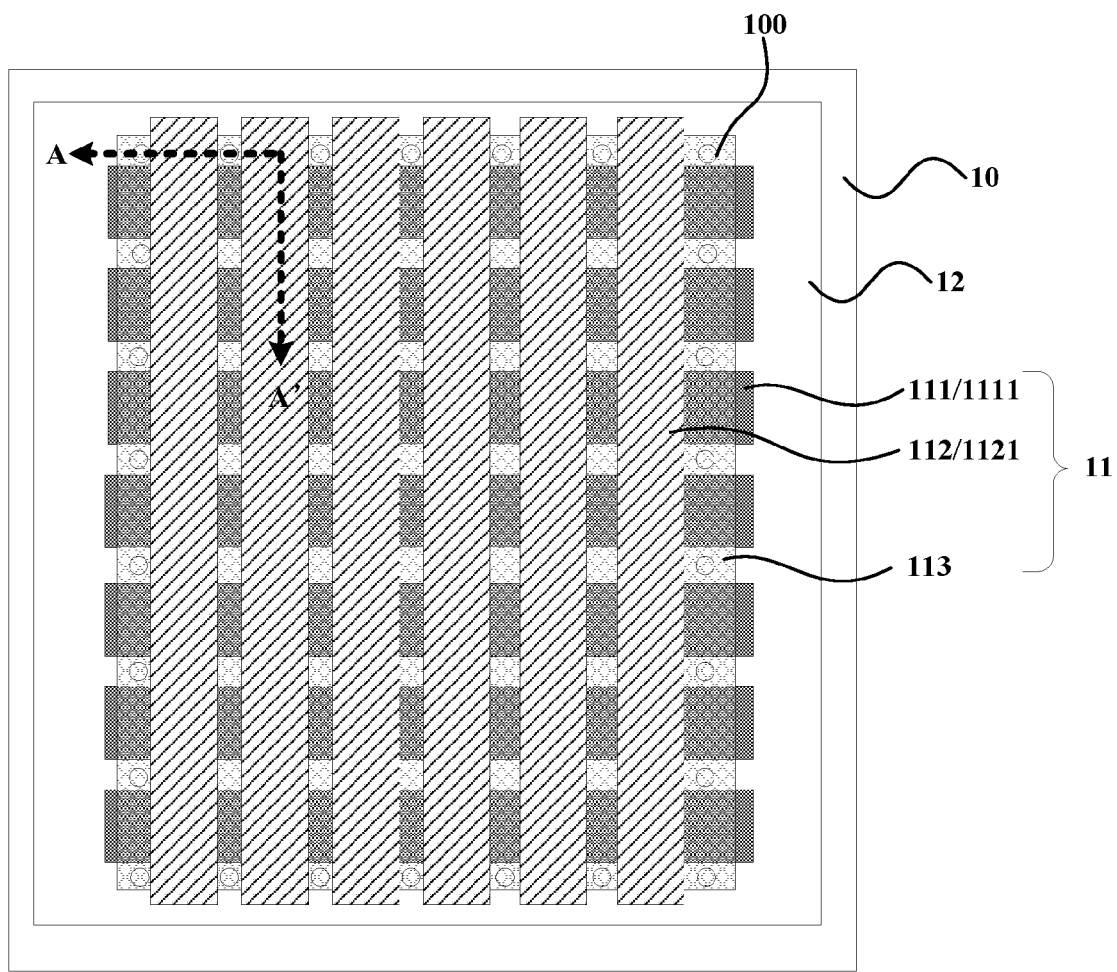
FIG. 1A is a top view showing a structure of an organic light emitting display panel according to an embodiment of the present invention.

The disclosure will be further described in detail below in conjunction with the accompanying drawings and embodiments. It should be noted that the specific embodiments disclosed herein are intended for explaining, rather than limiting, the disclosure. It should also be noted that the accompanying drawings show only some parts relating to the disclosure, but not in an exhaustive way, for the ease of description.

An organic light emitting display panel is provided by an embodiment of the present invention. The organic light emitting display panel includes: a substrate, a light emitting element layer disposed on the substrate, and an encapsulation layer disposed on the light emitting element layer. The light emitting element layer is provided with a plurality of first grooves and the plurality of first grooves is filled by the encapsulation layer.

Typically, the light emitting element layer of the organic light emitting display panel is formed by means of evaporation. The light emitting element layer may have a multi-layer structure. In addition to the light emitting layer, the light emitting element layer further includes an electron transport layer, a hole transport layer, an electron injection layer and a hole injection layer. The electron transport layer and the hole transport layer are used for balancing transports of electrons and holes. The electron injection layer and the hole injection layer are used for enhancing the injections of electrons and holes.

Since the light emitting element layer of the organic light emitting display panel is very sensitive to external environment factors such as moisture and oxygen, the performance of the organic light emitting display panel could be degraded dramatically or completely breakdown if the light emitting element layer of the organic light emitting display panel is exposed in an environment with moisture and oxygen. For improving the lifetime and stability of the organic light emitting display panel, the light emitting element layer requires to be covered by an encapsulation layer for sealing.

The encapsulation layer may be one-layer structure or multi-layer structure. The material of the encapsulation layer may be an organic film or an inorganic film, or layered-structure of the organic film and inorganic film.

Due to the weak adhesion force between the encapsulation layer and the light emitting element layer, the encapsulation layer and the light emitting element layer are easily detached from each other when the organic light emitting display panel is bent, especially when the substrate is a flexible substrate. According to the present invention, a plurality of first grooves are provided at the light emitting element layer and the plurality of first grooves are fully filled with the encapsulation layer that covers the light emitting element layer, so that the encapsulation layer is pinned in the light emitting element layer, thereby increasing the adherence ability between the encapsulation layer and the light emitting element layer and avoiding the detaching of the encapsulation layer from the light emitting element layer during a bending process.

The technical scheme of embodiments of the present invention will be clearly and completely described in conjunction with the accompanying drawings of embodiments of the invention. All other embodiments obtained based on embodiments of the invention by the person skilled in the art without inventive step should fall in the scope of protection of the disclosure.

Figure 1B:
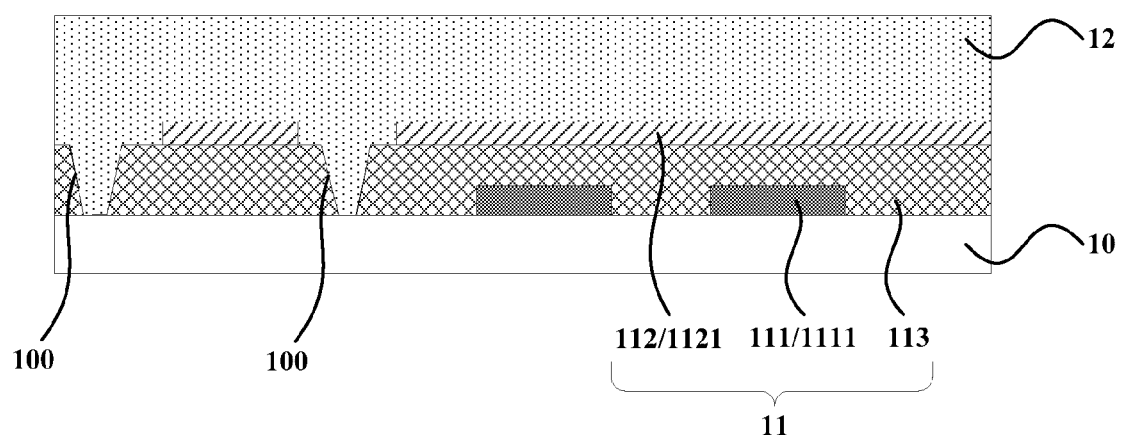
FIG. 1B is a schematic diagram showing the cross-sectional structure taken along line AA' of FIG. 1A.

FIG. 1A is a top view showing a structure of an organic light emitting display panel according to an embodiment of the present invention. FIG. 1B is a schematic diagram showing the cross-sectional structure taken along line AA' of FIG. 1A. As shown in FIGS. 1A and 1B, the organic light emitting display panel includes a substrate 10, a light emitting element layer 11 disposed on the substrate 10, and an encapsulation layer 12 disposed on the light emitting element layer 11. The light emitting element layer 11 is provided with a plurality of first grooves 100. The plurality of first grooves 100 are filled with the encapsulation layer 12. The light emitting element layer 11 includes a first electrode layer 111, a second electrode layer 112 and a light emission functioning layer 113 disposed between the first electrode layer 111 and the second electrode layer 112. The first electrode layer 111 includes a plurality of first sub-electrodes 1111 arranged in parallel to each other. The second electrode layer 112 includes a plurality of second sub-electrodes 1121 arranged in parallel to each other. The plurality of first sub-electrodes 1111 is insulated from and intersected with the plurality of second sub-electrodes 1121.

The organic light emitting display panel shown in FIGS. 1A and 1B is a passive organic light emitting display panel. That is, a pixel (namely a light emitting portion) is formed at the intersection between the first sub-electrode and the second sub-electrodes. An external circuit applies currents to the selected first sub-electrode and second sub-electrode for determining which pixels are to emit light and which pixels are not to emit light. In addition, the luminance of each pixel is proportional to the magnitude of the current applied thereto.

It should be noted that, in FIGS. 1A and 1B, vertical projections of the plurality of first grooves 100 on the substrate 10 do not overlap with vertical projections of the plurality of first sub-electrodes 1111 and the plurality of second sub-electrodes 1121 on the substrate 10, respectively. That is, the plurality of first grooves 100 is disposed at intervals between the plurality of first sub-electrodes 1111 and the plurality of second sub-electrodes 1121. Such an arrangement has the advantage in that it prevents the first grooves 100 from penetrating the first sub-electrodes 1111 and/or the second sub-electrodes 1121 to affect the display effect of the organic light emitting display panel. As shown in FIGS. 1A and 1B, the depth of the first groove 100 is exemplarily set to be the thickness of the light emission functioning layer 113, but it is not limited to the embodiments disclosed herein. In other embodiments, the depth of the first groove 100 may be set to be less than the thickness of the light emission functioning layer 113.

In the case that a depth of a given one of plurality of the first grooves is equal to a thickness of the light emission functioning layer 113, the substrate 10 may also be provided with a plurality of grooves (not shown in FIG. 1B). A depth of the groove of the substrate 10 is less than a thickness of the substrate 10, and the groove of the substrate 10 may interface with the first groove 100. With such an arrangement, the encapsulation layer 12 may also extend into the grooves of the substrate, so that a pinning structure is formed between the encapsulation layer 12 and the substrate 10.

According to the present embodiment, the light emitting element layer is provided with a plurality of first grooves, and the plurality of first grooves is filled with the encapsulation layer, so that a pinning structure is formed between the encapsulation layer and the light emitting element layer, thereby increasing the adherence ability between the encapsulation layer and the light emitting element layer and avoiding the detaching of the encapsulation layer from the light emitting element layer.

Figure 2A:
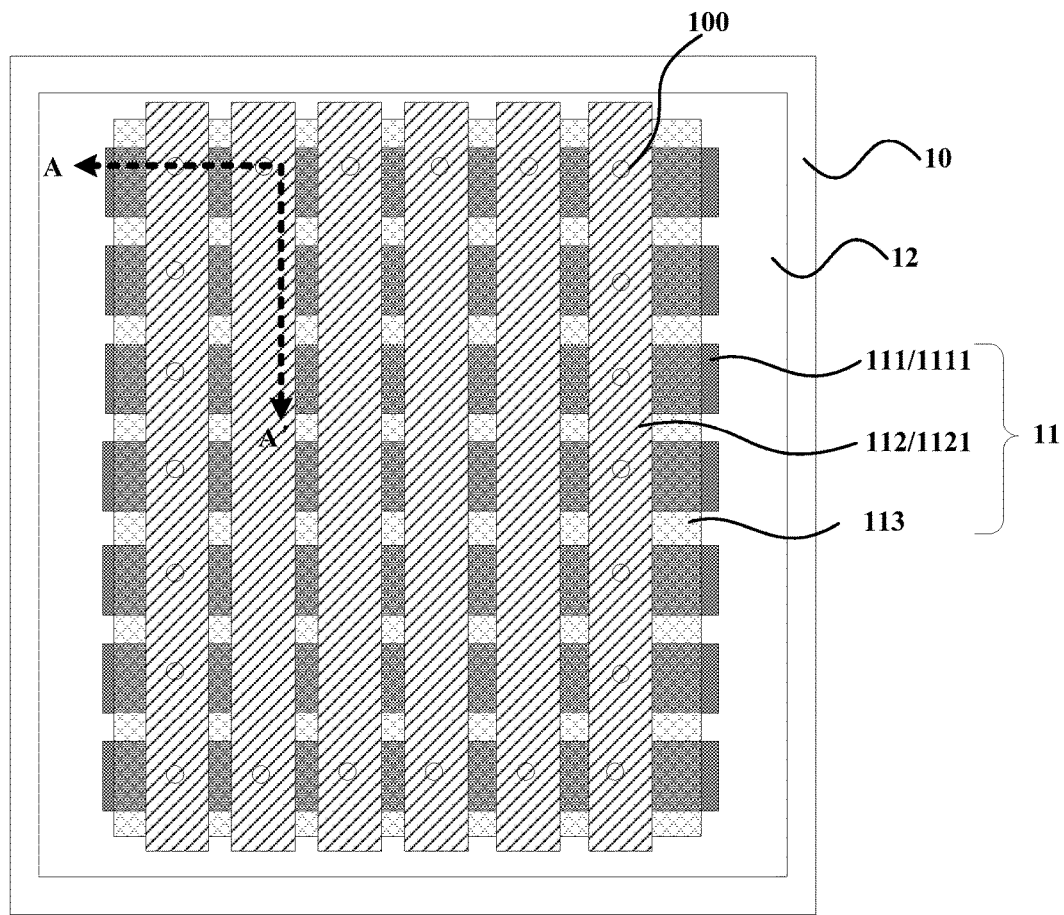
FIG. 2A is a top view showing a structure of another organic light emitting display panel according to an embodiment of the present invention.
Figure 2B:
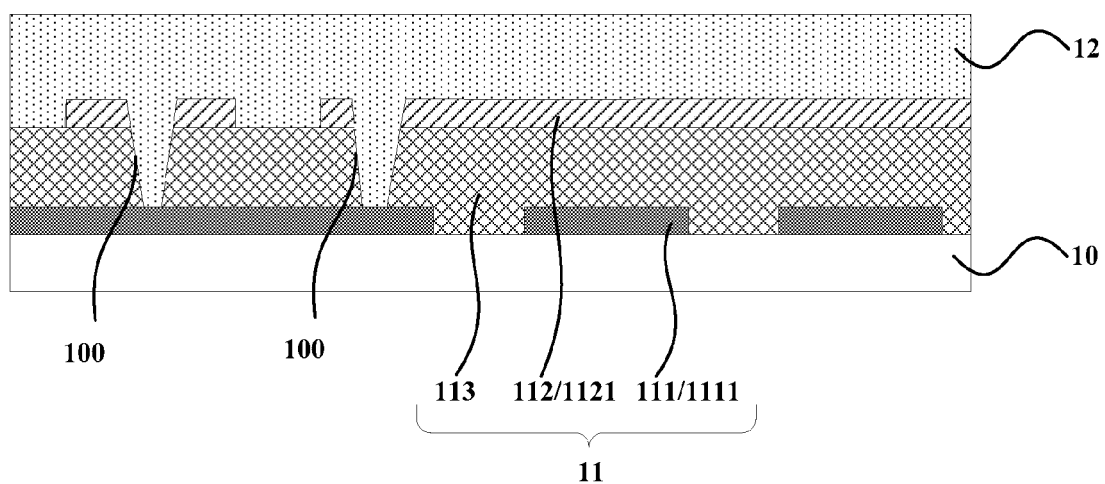
FIG. 2B is a schematic diagram showing the cross-sectional structure taken along line AA' of FIG. 2A.

In other embodiments, as shown in FIGS. 2A and 2B, vertical projections of the plurality of first grooves 100 on the substrate 10 overlap with vertical projections of the plurality of first sub-electrodes 1111 and second sub-electrodes 1121 on the substrate 10, if the intervals between the first sub-electrodes and the second sub-electrodes are relatively small and hence there is not enough space to provide the plurality the first groove.

A person skilled in the art may set the depth of the first groove according to the requirements of actual application scenarios, and the depth of the first groove 100 is less than or equal to a sum of a thickness of the first electrode layer, a thickness of the light emission functioning layer and a thickness of the second electrode layer. Illustratively, as shown in FIGS. 2A and 2B, the depth of the first groove is set to be equal to a sum of the thickness of the second electrode layer 112 and the thickness of the light emission functioning layer. If the depth of the first groove 100 is equal to the sum of a thickness of the first electrode layer, a thickness of the light emission functioning layer and a thickness of the second electrode layer, the substrate 10 may also be provided with a plurality of grooves (not shown in FIG. 2B), the depth of the groove of the substrate 10 is less than the thickness of the substrate 10, and the groove of the substrate 10 may interface with the first groove 100. In such an arrangement, the encapsulation layer 12 and the substrate 10 can form a pinning structure.

It should be noted that, as illustratively shown in FIGS. 1A to 2B, the plurality of first grooves 100 are disposed at the edge of the substrate 10, but it is not limited to embodiments disclosed herein. For example, a first groove 100 may be provided at each of the intersections between the plurality of first sub-electrodes 1111 and the plurality of second sub-electrodes 1121.

Figure 3A:
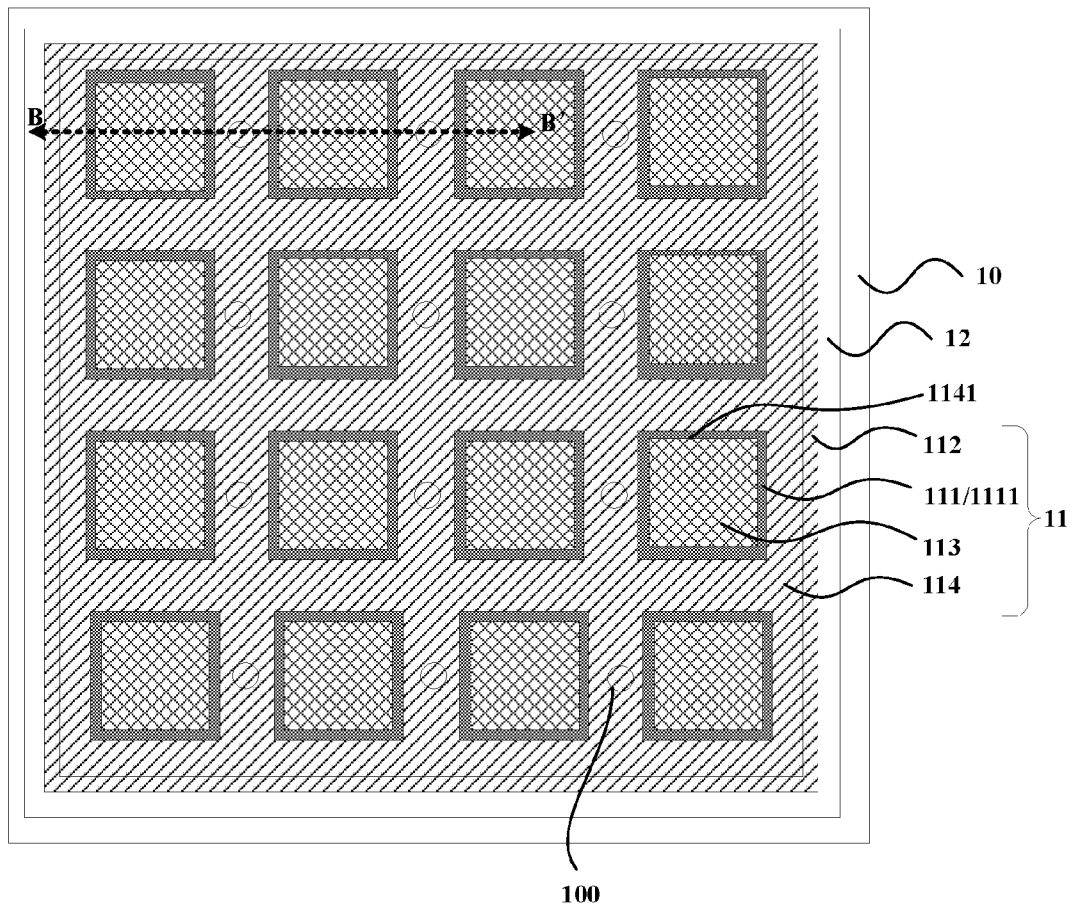
FIG. 3A is a top view showing a structure of still another organic light emitting display panel according to an embodiment of the present invention.
Figure 3B:
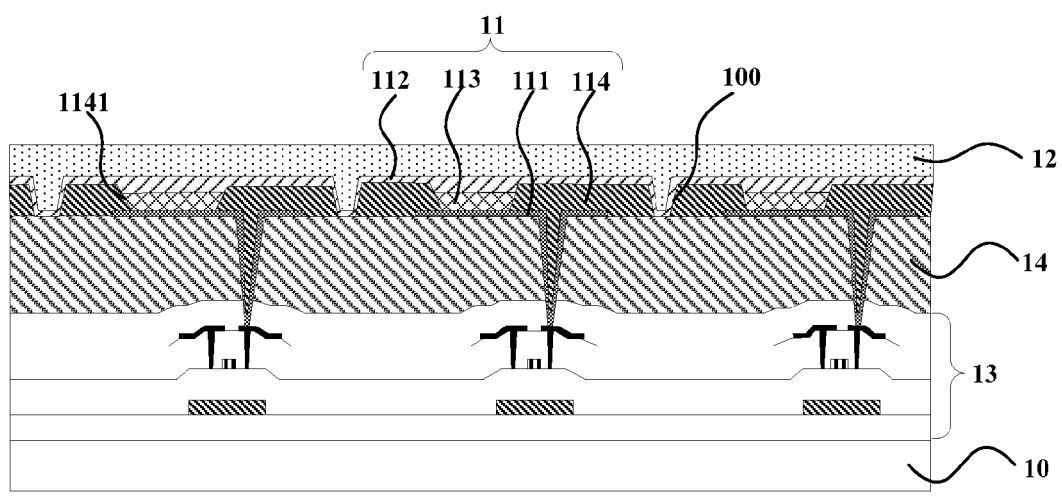
FIG. 3B is a schematic diagram showing the cross-sectional structure taken along line BB' of FIG. 3A.

FIG. 3A is a top view showing a structure of still another organic light emitting display panel according to an embodiment of the present invention. FIG. 3B is a schematic diagram showing the cross-sectional structure taken along line BB' of FIG. 3A. As shown in FIGS. 3A and 3B, the organic light emitting display panel includes a substrate 10, a light emitting element layer 11 disposed on the substrate 10, and an encapsulation layer 12 disposed on the light emitting element layer 11. The light emitting layer 11 is provided with a plurality of first grooves 100. The encapsulation layer 12 is filled with the plurality of the first grooves 100. A thin film transistor array layer 13 is further disposed between the substrate 10 and the light emitting element layer 11. A planarization layer 14 is disposed between the thin film transistor array layer 13 and the light emitting element layer 11. The light emitting element layer 11 includes a first electrode layer 111, a pixel defining layer 114, a light emission functioning layer 113 and a second electrode layer 112. The pixel defining layer 114 is provided with a plurality of openings 1141. The organic light emitting display panel includes a luminous zone and a non-luminous zone. The plurality of openings 1141 of the pixel defining layer 114 are used for defining the luminous zone and the non-luminous zone. Since the light emission functioning layer 113 is disposed in the plurality of openings 1141, an area corresponding to the plurality of openings 1141 is the luminous zone, an area of the pixel defining layer 114 other than the plurality of openings 1141 is the non-luminous zone. According to the present embodiment, the plurality of openings 1141 are disposed at the area of the pixel defining layer corresponding to the luminous zone, the light emission functioning layer 113 is disposed in the plurality of openings 1141 corresponding to the luminous zone, and the plurality of first grooves 100 are disposed in the area, corresponding to the non-luminous zone, of the pixel defining layer 114. The first electrode layer 111 includes a plurality of first sub-electrodes 1111, each of which is electrically connected with a corresponding thin film transistor 131 of the thin film transistor array layer 13. The second electrode layer 112 is a planar electrode.

The organic light emitting display panel shown in FIGS. 3A and 3B is an active organic light emitting display panel. That is, the plurality of first sub-electrodes 1111 of the first electrode layer and the planar second electrode layer 112 form pixels (namely light emitting portions), respectively. Each pixel is provided with a thin film transistor having a switching function. That is, each of the plurality of first sub-electrodes is electrically connected with a corresponding thin film transistor of the thin film transistor array layer 13. The thin film transistors electrically connected with the first sub-electrodes 1111 are configured to control a light-emitting state of each pixel based on a data signal.

Optionally, referring to FIG. 3A, orthographic projections of the plurality of first grooves 100 on the substrate 10 are located within an orthographic projection of the pixel defining layer 114 on the substrate 10.

In the present embodiment, the depth of one of the first grooves 100 is less than or equal to the thickness of the pixel defining layer 114. As illustrated in FIG. 3B, the depth of the first groove 100 is set to be equal to the thickness of the pixel defining layer 114.

Figure 4:
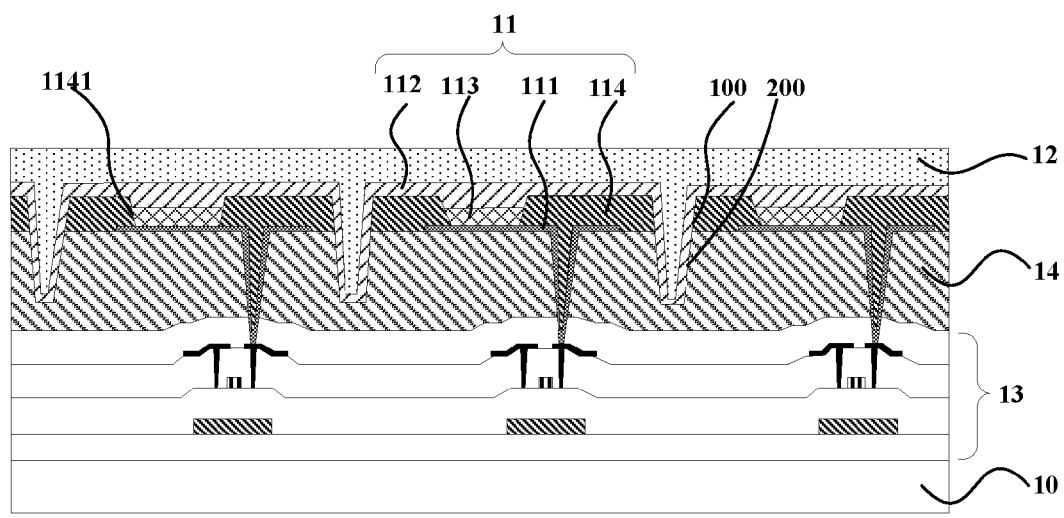
FIG. 4 is a schematic diagram showing a cross-sectional structure of still another organic light emitting display panel according to an embodiment of the present invention.

FIG. 4 is a schematic diagram showing a cross-sectional structure of still another organic light emitting display panel according to an embodiment of the present invention. As shown in FIG. 4, the first groove 100 runs through the pixel defining layer 114 in a direction perpendicular to the substrate 10. Unlike the FIG. 3B, the planarization layer 14 is provided with a plurality of second grooves 200, each of which interfaces with a respective one of the first grooves 100, and a depth of each of the second grooves 200 is less than or equal to a thickness of the planarization layer 14. A depth of the second groove 200 as illustratively shown in FIG. 4 is less than a thickness of the planarization layer 14.

Figure 5:
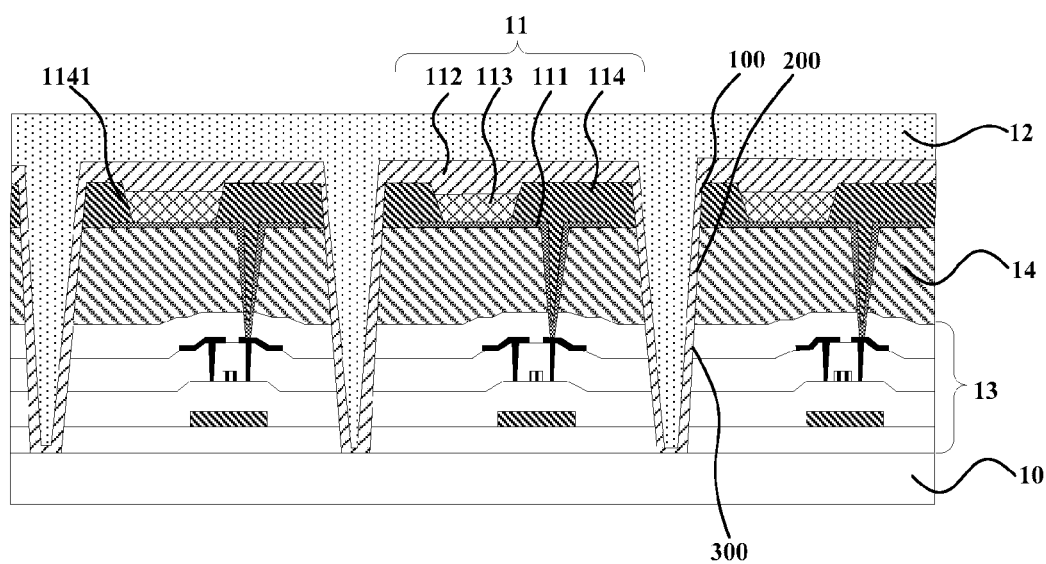
FIG. 5 is a schematic diagram showing a cross-sectional structure of still another organic light emitting display panel according to an embodiment of the present invention.

FIG. 5 is a schematic diagram showing a cross-sectional structure of still another organic light emitting display panel according to an embodiment of the present invention. As shown in FIG. 5, unlike the FIG. 4, each of the first grooves 100 runs through the pixel defining layer 114 in a direction perpendicular to the substrate 10; each of the second grooves 200 runs through planarization layer 14; the thin film transistor array film 13 is provided with a plurality of third grooves interfacing with the second grooves 200; and a depth of the third groove is less than or equal to a thickness of the thin film transistor array layer 13, the depth of the third groove 300 as illustratively shown in FIG. 5 is equal to the thickness of the thin film transistor array layer 13.

If the depth of the third groove 300 is equal to the thickness of the thin film transistor array layer 13, the substrate 10 may be also provided with a plurality grooves (not shown in FIG. 5). The depth of the groove of the substrate 10 is less than the thickness of the substrate 10, and the groove of the substrate 10 may interface with the third groove 300. In such an arrangement, the encapsulation layer 12 and the substrate 10 can form a pinning structure.

Figure 6:
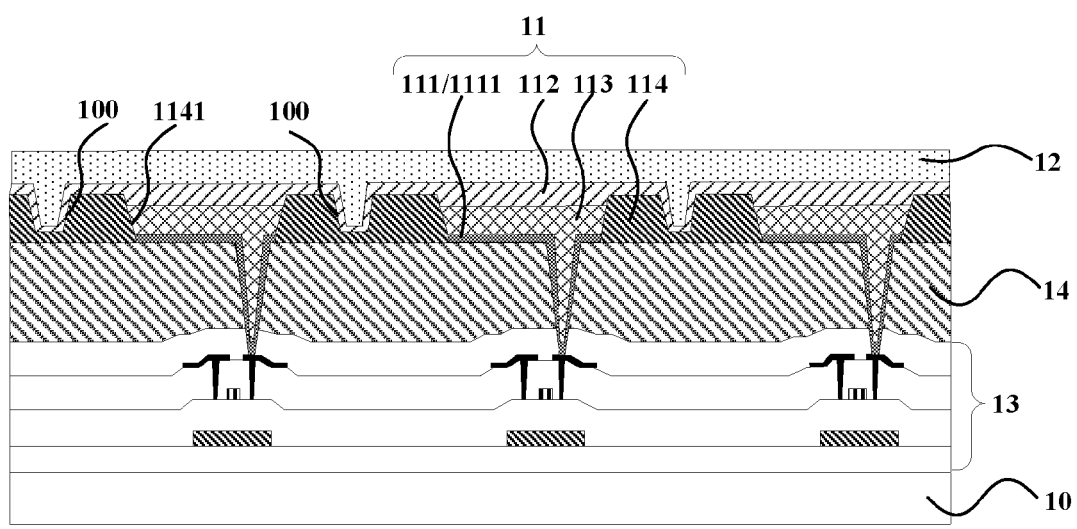
FIG. 6 is a schematic diagram showing a cross-sectional structure of still another organic light emitting display panel according to an embodiment of the present invention.

FIG. 6 is a schematic diagram showing a cross-sectional structure of still another organic light emitting display panel according to an embodiment of the present invention. As shown in FIG. 6, unlike FIGS. 3B to 5, the plurality of first sub-electrodes 1111 may also be disposed in the openings 1141 of the pixel defining layer 114.

Optionally, the organic light emitting display panels in the above embodiments may be top-emitting type or bottom-emitting type. The light emitting direction of the organic light emitting display panel is not intended to be limiting. In both the top-emitting type and bottom-emitting type of organic light emitting display panel, at least one of the first electrode layer and the second electrode layer is required to be arranged as a transparent conductive layer. In other embodiments, both the first electrode layer and second electrode layer may be arranged as a transparent conductive layer.

Optionally, in order to increase the luminous efficiency of the top-emitting type or bottom-emitting type organic light emitting display panel, the first electrode layer is arranged as a metal reflective electrode, and the second electrode layer is arranged as a transparent conductive layer; or, the first electrode layer is arranged as a transparent conductive layer, and the second electrode layer is arranged as a metal reflective electrode.

Figure 7:
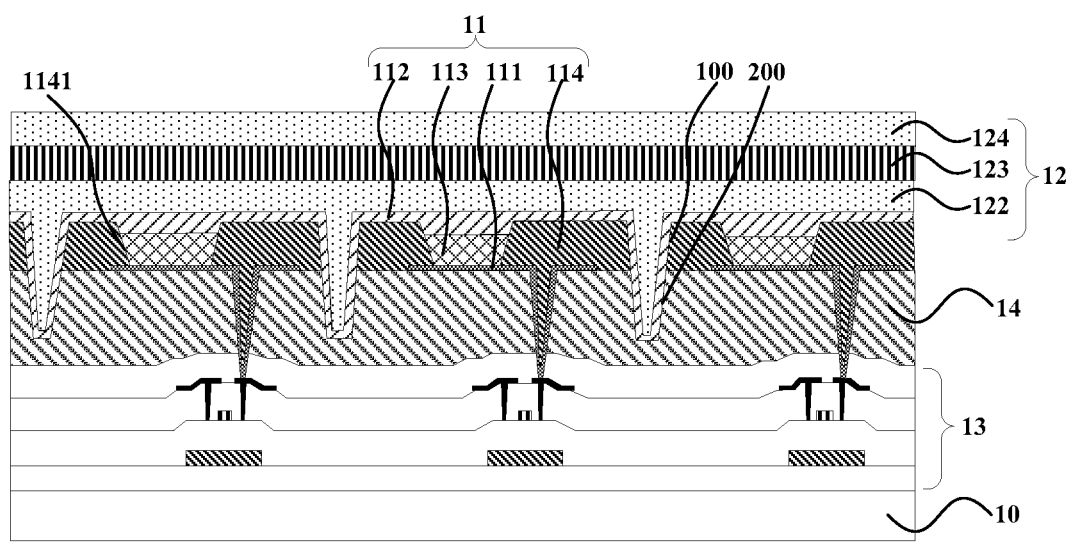
FIG. 7 is a schematic diagram showing a cross-sectional structure of still another organic light emitting display panel according to an embodiment of the present invention.

The encapsulation layer in embodiments of the present invention may be a one-layer structure or a multi-layer structure. The material of the encapsulation layer may be organic or inorganic. Alternatively, the encapsulation layer may be a layered-structure of the organic layer and inorganic layer. For example, the encapsulation layer includes at least one inorganic layer and at least one organic layer. The inorganic layer has better barrier properties against moisture and oxygen than the organic layer, but has a poor film-forming property, flatness and uniformity. The organic layer has a better film-forming property and a dense surface with almost no pinholes formed, but has a poor barrier effect against moisture and oxygen. As a result, it may be arranged in an embodiment that the light emission functioning layer is contacted with an inorganic layer and in turn the inorganic layer is covered by an organic layer, so that the alternately stacked organic layer and inorganic layer make up a complementary isolation unit against moisture and oxygen for increasing the tightness of the encapsulation. FIG. 7 is a schematic diagram showing a structure of still another organic light emitting display panel according to an embodiment of the present invention. As shown in FIG. 7, the encapsulation layer 12 includes a first inorganic layer 122, a first organic layer 123 and a second inorganic layer 124 sequentially disposed in a direction from the substrate 10 to the light emitting element layer 11.

Figure 8:
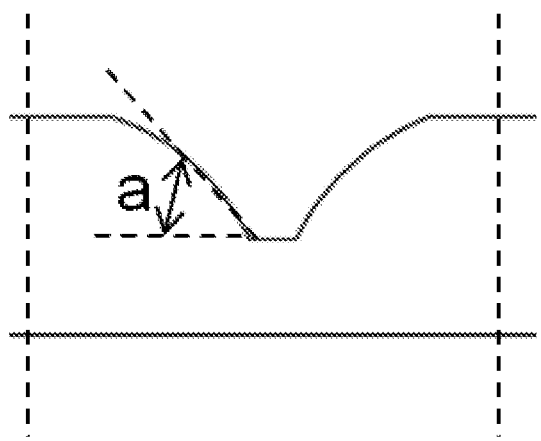
FIG. 8 is a schematic diagram showing a structure of the first grooves of the organic light emitting display panel according to an embodiment of the present invention.

FIG. 8 is a schematic diagram showing a structure of the first groove of the organic light emitting display panel according to an embodiment of the present invention. Optionally, the first groove has an arc-shaped sidewall. The design of arc-shaped sidewall can effectively reduce the stain generated at the first groove in the process of bending the organic light emitting display panel. An angel between a tangent of the sidewall of the first groove and a bottom surface of the first groove is a. Optionally, the angle $\alpha$ is in a range of 0 degree to 60 degrees.

Figure 9:
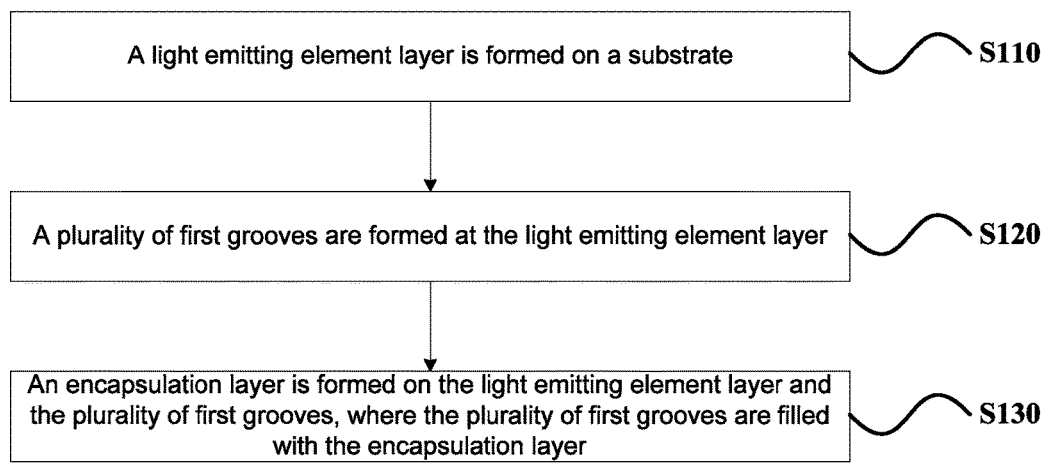
FIG. 9 is a flowchart showing a method for fabricating an organic light emitting display panel according to an embodiment of the present invention.

Based on the same concept, an embodiment of the present invention further provides a method for fabricating an organic light emitting display panel. FIG. 9 is a flowchart showing a method for fabricating an organic light emitting display panel according to an embodiment of the present invention. As shown in FIG. 9, the method includes:

In step S110, a light emitting element layer is formed on a substrate.

In step S120, a plurality of first grooves are formed at the light emitting element layer.

In step S130, an encapsulation layer is formed on the light emitting element layer and the plurality of first grooves. The plurality of first grooves is filled with the encapsulation layer.

According to the present invention, the light emitting element layer is provided with a plurality of first grooves and the plurality of first grooves are filled with the encapsulation layer which covers the light emitting element layer, accordingly. A pinning structure is formed between the encapsulation layer and the light emitting element layer, thereby increasing the adherence ability between the encapsulation layer and the light emitting element layer and avoiding the detaching of the encapsulation layer from the light emitting element layer during a bending process.

Figure 10:
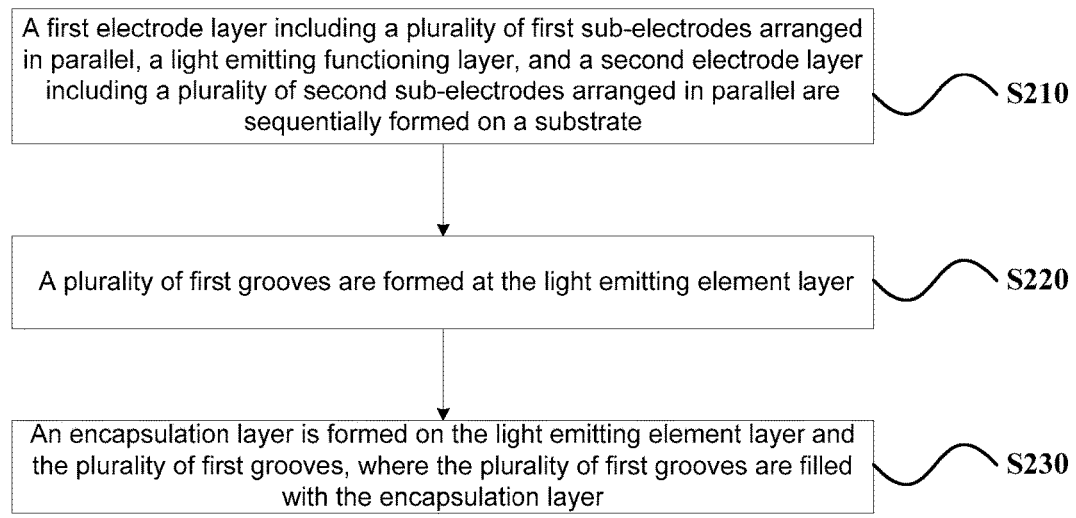
FIG. 10 is a flowchart showing another method for fabricating an organic light emitting display panel according to an embodiment of the present invention.

FIG. 10 is a flowchart showing another method for fabricating an organic light emitting display panel according to an embodiment of the present invention. As shown in FIG. 10, the method includes:

In step S210, a first electrode layer including a plurality of first sub-electrodes arranged in parallel to each other, a light emission functioning layer, and a second electrode layer including a plurality of second sub-electrodes arranged in parallel to each other are sequentially formed on a substrate.

The plurality of first sub-electrodes are insulated from and intersected with the plurality of second sub-electrodes.

Figure 11A:
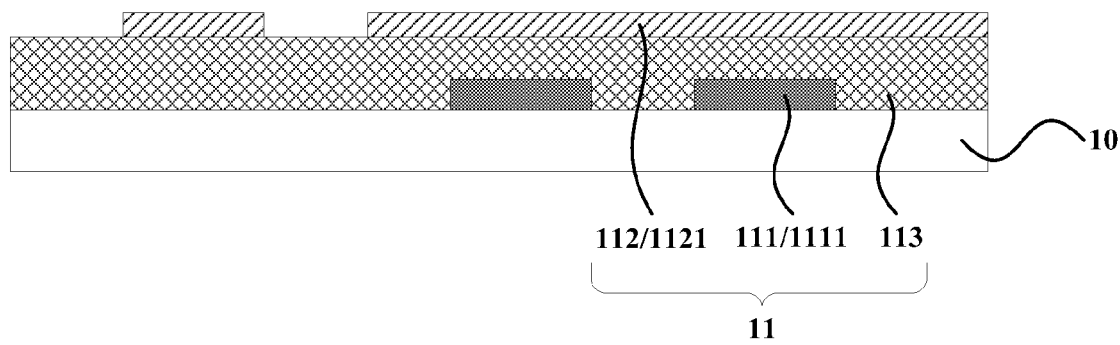
FIG. 11A is a schematic diagram showing the cross-sectional structure in step 210.

FIG. 11A is a schematic diagram showing the cross-sectional structure in step 210. As shown in FIG. 11A, the first electrode layer 111 including the plurality of first sub-electrodes 1111 arranged in parallel to each other, the light emission functioning layer 113, and the second electrode layer 112 including the plurality of second sub-electrodes 1121 arranged in parallel to each other are sequentially formed on a substrate 10. The first electrode layer 111, the light emission functioning layer 113 and the second electrode layer 112 make up a light emitting element layer 11.

In step S220, a plurality of first grooves are formed at the light emitting element layer.

Figure 11B:
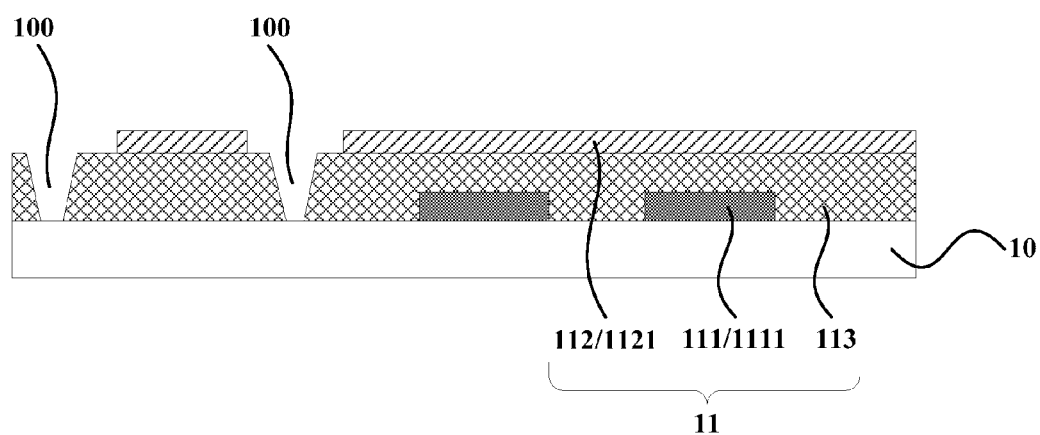
FIG. 11B is a schematic diagram showing the cross-sectional structure in step 220.

FIG. 11B is a schematic diagram showing the cross-sectional structure in step 220. As shown in FIG. 11B, a plurality of first grooves 100 is formed on the light emitting element layer 11. As exemplarily shown in FIG. 11B, the plurality of first grooves 100 are provided on the light emission functioning layer 113 at intervals between the first sub-electrodes 1111 and second sub-electrodes 1112. Vertical projections of the plurality of first grooves 100 on the substrate 10 do not overlap with vertical projections of the plurality of first sub-electrodes 1111 and the plurality of second sub-electrodes 1121 on the substrate 10, respectively. In other embodiments, if the intervals between the first sub-electrodes 1111 and the second sub-electrodes 1121 are small, there is no enough space for disposing the plurality of first grooves, then the plurality of first grooves can be provided at the overlaps of the first sub-electrodes 1111 and the second sub-electrodes 1112, the specific structure is shown in FIGS. 2A and 2B.

In step S230, an encapsulation layer is formed on the light emitting element layer and the plurality of first grooves. The plurality of first grooves is filled with the encapsulation layer.

Figure 11C:
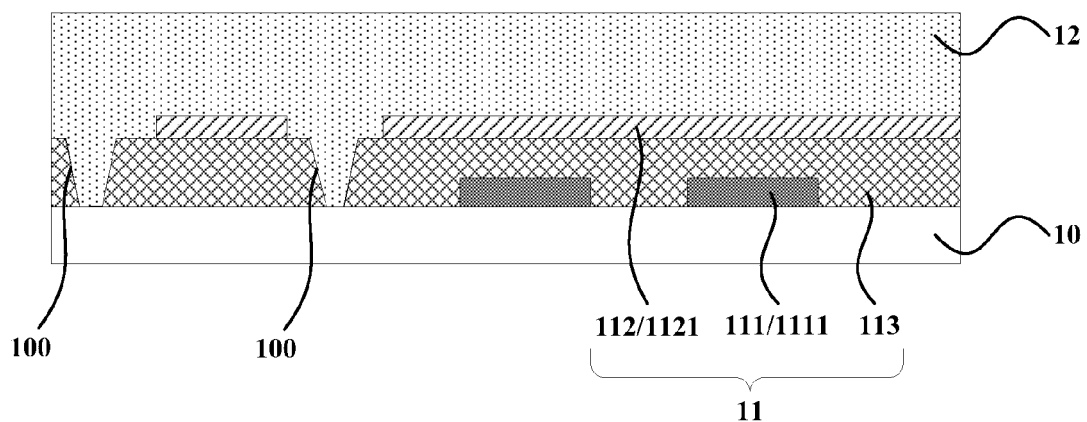
FIG. 11C is a schematic diagram showing the cross-sectional structure in step 230.

FIG. 11C is a schematic diagram showing the cross-sectional structure in step 230. As shown in FIG. 11C, an encapsulation layer 12 is formed on the light emitting element layer 11 and the plurality of first grooves 100, and the plurality of first grooves 100 is filled with the encapsulation layer 12.

The organic light emitting display panel provided by the present embodiment of the invention is a passive organic light emitting display panel. That is, pixels (namely, light-emitting portions) are formed at the intersections between the first sub-electrodes and the second sub-electrodes. An external circuit applies currents to the selected first sub-electrode and second sub-electrode so as to determine which pixel is to emit light and which pixel is not to emit light. In addition, the luminance of each pixel is proportion to the magnitude of the applied currents.

Optionally, a depth of a given one of plurality of the first grooves 100 is less than or equal to a thickness of the light emission functioning layer 113. In the structure shown in FIG. 2B, the depth of the first groove 100 is less than or equal to a sum of a thickness of the first electrode layer, a thickness of the light emission functioning layer and a thickness of the second electrode layer.

Figure 12:
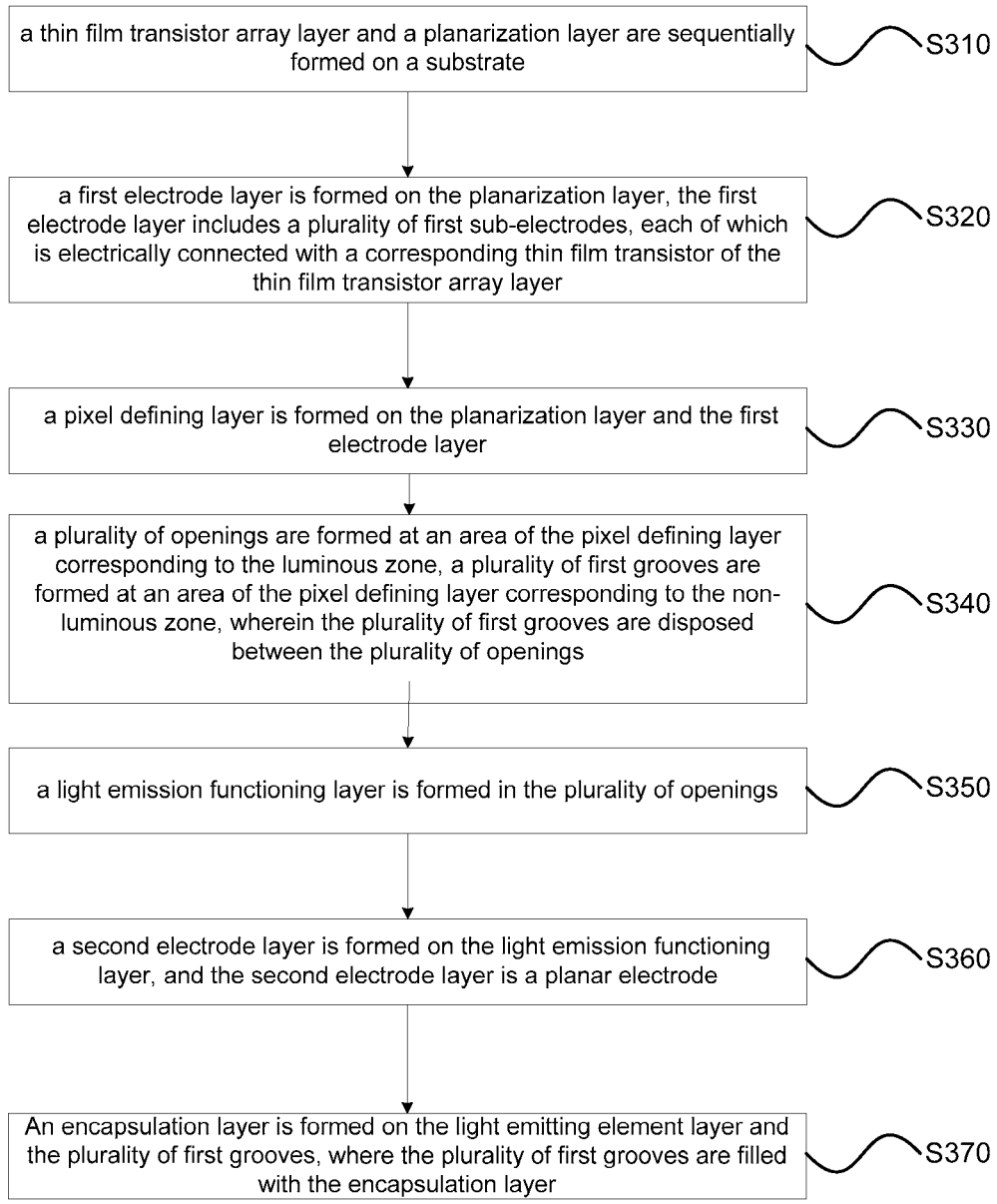
FIG. 12 is a flowchart showing still another method for fabricating an organic light emitting display panel according to an embodiment of the present invention.

FIG. 12 is a flowchart showing another method for fabricating an organic light emitting display panel according to an embodiment of the present invention. As shown in FIG. 12, the method includes:

In step S310, a thin film transistor array layer and a planarization layer are sequentially formed on a substrate.

Figure 13A:
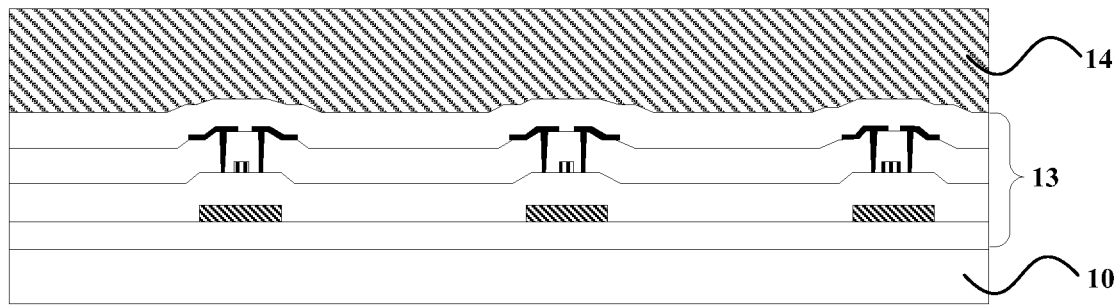
FIG. 13A is a schematic diagram showing the cross-sectional structure in step 310.

FIG. 13A is a schematic diagram showing the cross-sectional structure in step 310. As shown in FIG. 13A, a thin film transistor array layer 13 and a planarization layer 14 are sequentially formed on a substrate 10. The thin film transistor array layer 13 includes a plurality of thin film transistors which are configured to drive the organic light emitting display panel to emit light so as to display. Since the surface of the thin film transistor array layer 13 has large undulation surface due to multiple etchings for patterning used in the fabrication process of the thin film transistor array layer 13, the planarization layer 14 is provided.

In step S320, a first electrode layer is formed on the planarization layer; the first electrode layer includes a plurality of first sub-electrodes; and each of the plurality of first sub-electrodes is electrically connected with a corresponding thin film transistor of the thin film transistor array layer.

Figure 13B:
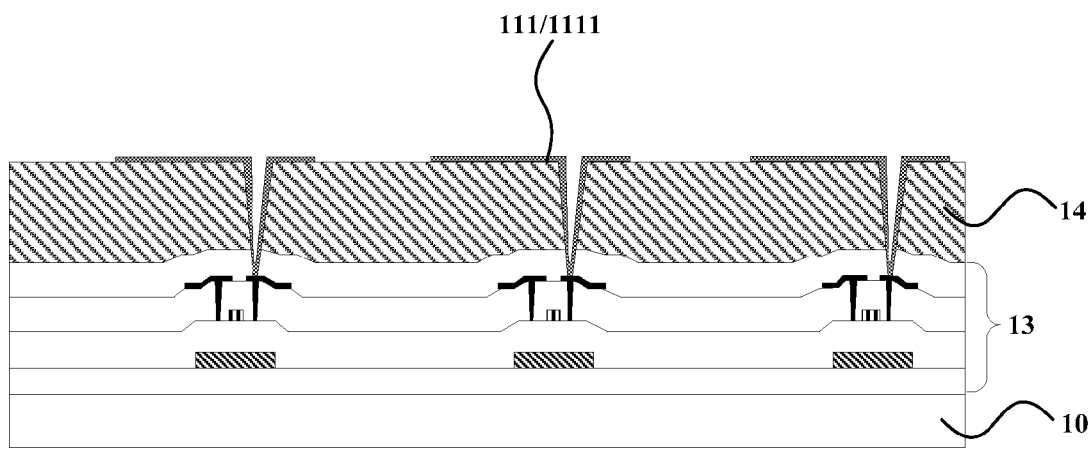
FIG. 13B is a schematic diagram showing the cross-sectional structure in step 320.

FIG. 13B is a schematic diagram showing the cross-sectional structure in step 320. As shown in FIG. 13B, in order to realize the connection between each first sub-electrodes 1111 of the first electrode layer 111 with the corresponding thin film transistor of the thin film transistor array layer 13, it is required to form a plurality of through holes firstly, each of which exposes a source electrode or drain electrode of the corresponding thin film transistor; and then the first electrode layer 111 is formed on the planarization layer 14. The first electrode layer 111 includes a plurality of first sub-electrodes 1111, each of which is electrically connected with a corresponding thin film transistor of the thin film transistor array layer 13 via a corresponding through hole.

In step S330, a pixel defining layer is formed on the planarization layer and the first electrode layer.

Figure 13C:
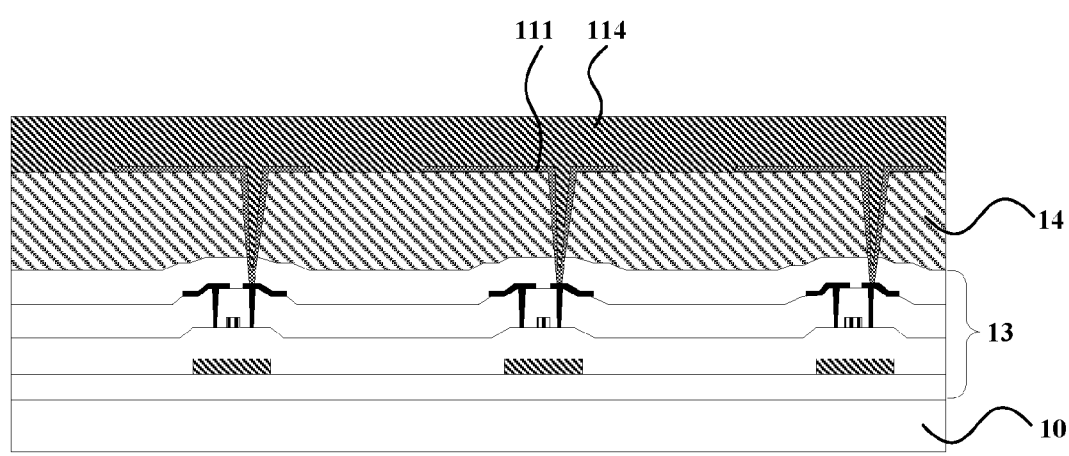
FIG. 13C is a schematic diagram showing the cross-sectional structure in step 330.

FIG. 13C is a schematic diagram showing the cross-sectional structure in step 330. As shown in FIG. 13C, a pixel defining layer 114 is formed on the planarization layer 14 and the first electrode layer 111.

In step S340, a plurality of openings are formed at an area of the pixel defining layer corresponding to the luminous zone, and a plurality of first grooves are formed at an area of the pixel defining layer corresponding to the non-luminous zone, where each of the plurality of first grooves is disposed between the plurality of openings.

Figure 13D:
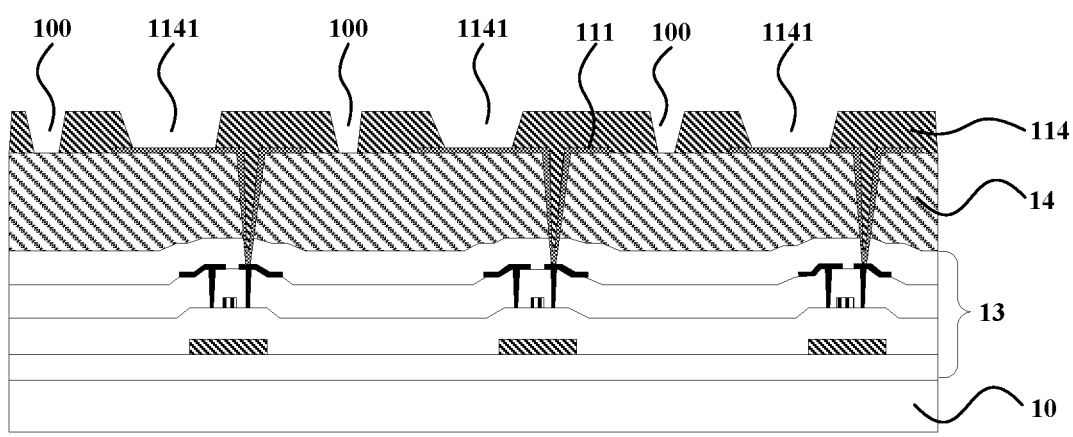
FIG. 13D is a schematic diagram showing the cross-sectional structure in step 340.

FIG. 13D is a schematic diagram showing the cross-sectional structure in step 340. As shown in FIG. 13D, the plurality of openings 1141 are formed at an area of the pixel defining layer 114 corresponding to the luminous zone, and the plurality of first grooves 100 are formed at an area of the pixel defining layer 114 corresponding to the non-luminous zone. Each of the plurality of first grooves 100 is disposed between the plurality of openings 1141. It should be noted that the plurality of openings 1141 and the plurality of first grooves 100 may be formed in a same process, or the plurality of openings 1141 and the plurality of first grooves 100 may be formed in different processes, respectively. The forming order of the plurality of openings 1141 and the plurality of first grooves 100 is not limited in embodiments of the present invention.

In step S350, a light emission functioning layer is formed in the plurality of openings.

Figure 13E:
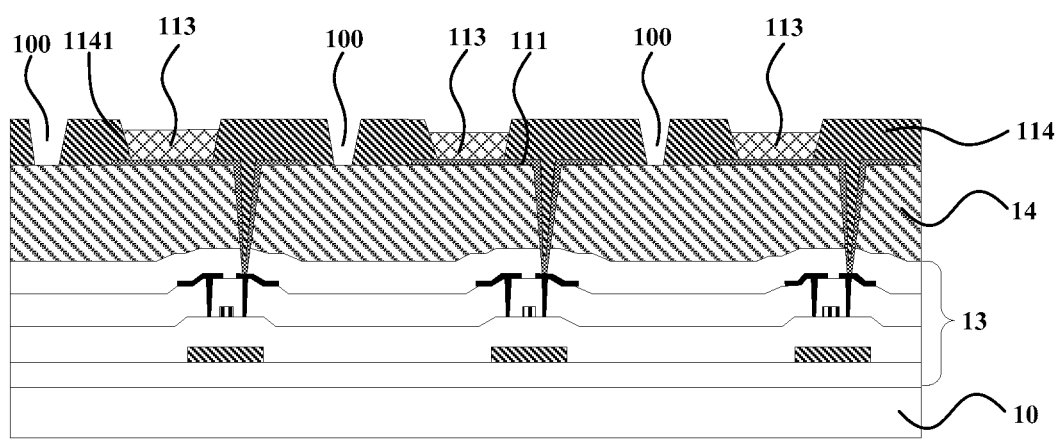
FIG. 13E is a schematic diagram showing the cross-sectional structure in step 350.

FIG. 13E is a schematic diagram showing the cross-sectional structure in step 350. As shown in FIG. 13E, the light emission functioning layer 114 is formed in the plurality of openings 1141.

The light emission functioning layer may include a multi-layer structure. For example, the light emission functioning layer includes a hole injection layer, a hole transport layer, a light emitting layer, an electron transport layer and an electron injection layer. The electron injection layer and the electron transport layer can effectively adjust the injection velocity and the injection amount of the electron, the hole injection layer and the hole transport layer can effectively adjust the injection velocity and the injection amount of the hole, thereby improving both the luminance and the illuminating efficiency of the organic light emitting display panel. It should be noted that in addition to the light emitting layer which is necessary to ensure the normal display of the organic light emitting display panel, those skilled in the art may selectively dispose other films according to requirements of actual products, taking into cost, luminance and the illuminating efficiency considerations. In addition, in order to reduce the mask cost in manufacturing, only the light emitting layer may be disposed in the plurality openings 1141, other layers (such as the hole injection layer, the hole transport layer, the electron transport layer and the electron injection layer) are fabricated on the entire plane.

In step S360, a second electrode layer is formed on the light emission functioning layer, and the second electrode layer is a planar electrode.

Figure 13F:
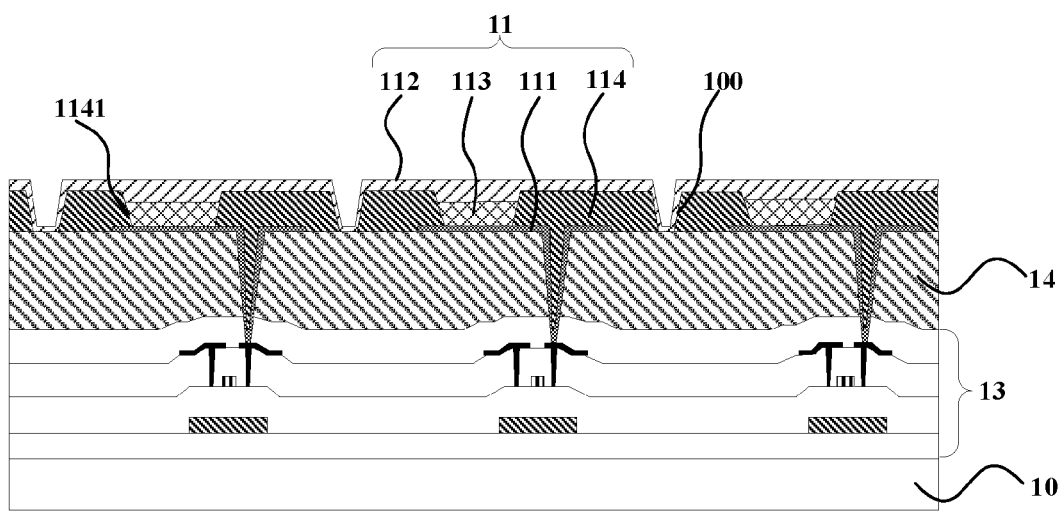
FIG. 13F is a schematic diagram showing the cross-sectional structure in step 360.

FIG. 13F is a schematic diagram showing the cross-sectional structure in step 360. As shown in FIG. 13F, the second electrode layer 112 is formed on the light emission functioning layer 113, and the second electrode layer 112 is a planar electrode. The light emitting element layer 11 of the present embodiment includes the first electrode layer 111, the pixel defining layer 114, the light emission functioning layer 113 and the second electrode layer 112.

In step S370, an encapsulation layer is formed on the light emitting element layer and the plurality of first grooves, and the plurality of first grooves are filled with the encapsulation layer.

Figure 13G:
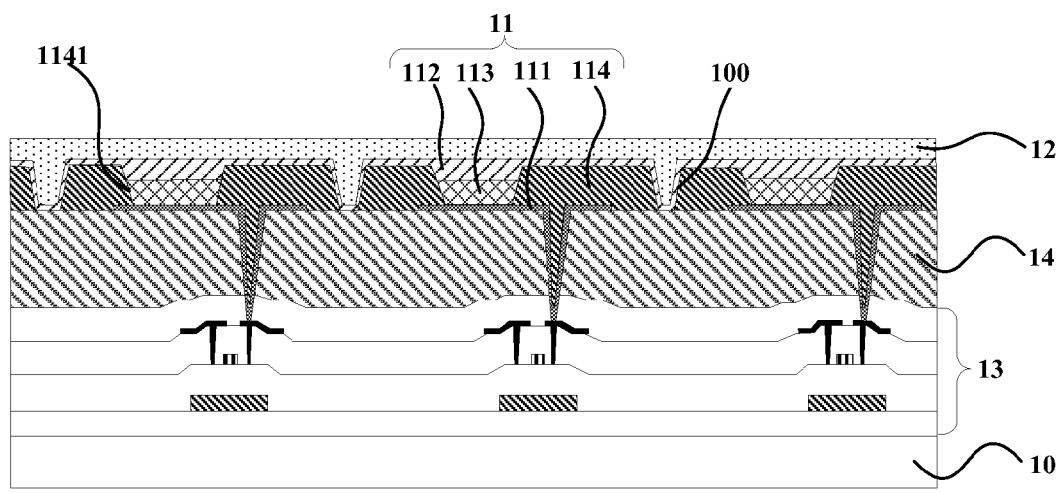
FIG. 13G is a schematic diagram showing the cross-sectional structure in step 370.

FIG. 13G is a schematic diagram showing the cross-sectional structure in step 370. As shown in FIG. 13G, an encapsulation layer 12 is formed on the light emitting element layer 11 and the plurality of first grooves 100, and the plurality of first grooves 100 are filled with the encapsulation layer 12.

The organic light emitting display panel provided by the present embodiment is active organic light emitting display panel. That is, the plurality of first sub-electrodes 1111 of the first electrode layer and the planar second electrode layer 112 make up pixels (namely the light emitting portions), respectively. Each pixel is provided with a thin film transistor having a switching function, that is, each first sub-electrode is electrically connected with a corresponding thin film transistor of the thin film transistor array layer 13. The luminescence state of each pixel is controlled based on a data signal by the thin film transistor electrically connected with the first sub-electrode 1111.

According to embodiments of the present invention, the depth of a given one of the first grooves 100 may be less than or equal to the thickness of the pixel defining layer 114. The depth of the first groove 100 is set to be equal to the thickness of the pixel defining layer 114 as illustratively shown FIG. 13F.

Figure 14:
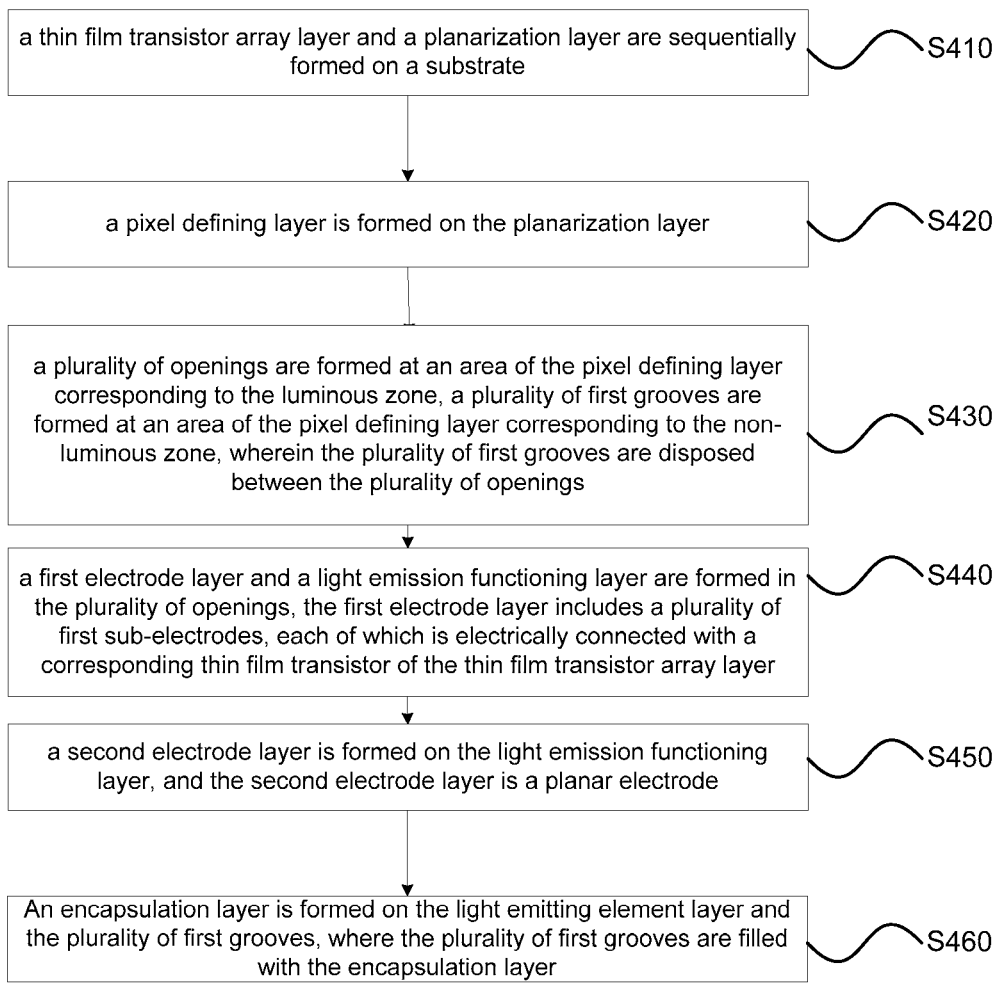
FIG. 14 is a flowchart showing still another method for fabricating an organic light emitting display panel according to an embodiment of the present invention.

FIG. 14 is a flowchart showing still another method for fabricating an organic light emitting display panel according to an embodiment of the present invention. As shown in FIG. 14, the method includes:

In step S410, a thin film transistor array layer and a planarization layer are sequentially formed a substrate.

The cross-sectional structure in step S410 is similar to that in step S310, please referring to FIG. 12A, which is not discussed again in the present embodiment.

In step S420, a pixel defining layer is formed on the planarization layer.

Figure 15A:
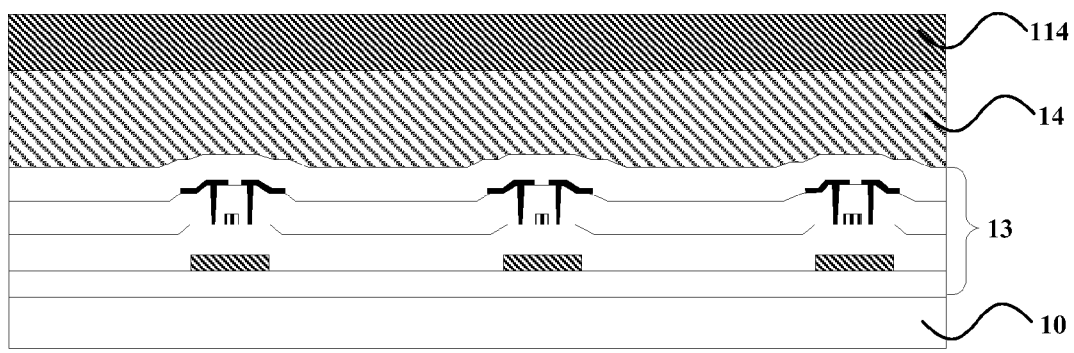
FIG. 15A is a schematic diagram showing the cross-sectional structure in step 420.

FIG. 15A is a schematic diagram showing the cross-sectional structure in step 420. As shown in FIG. 15A, the pixel defining layer 114 is formed on the planarization layer 14.

In step S430, a plurality of openings are formed at an area of the pixel defining layer corresponding to the luminous zone, a plurality of first grooves are formed at an area of the pixel defining layer corresponding to the non-luminous zone, and the plurality of first grooves are disposed between the plurality of openings.

Figure 15B:
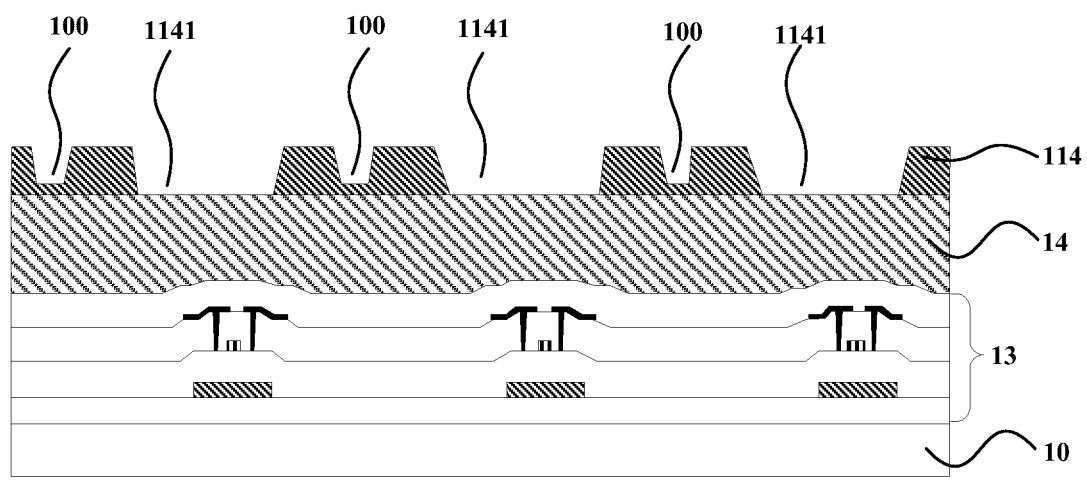
FIG. 15B is a schematic diagram showing the cross-sectional structure in step 430.

FIG. 15B is a schematic diagram showing the cross-sectional structure in step 430. As shown in FIG. 15B, the plurality of openings 1141 are formed at an area of the pixel defining layer 114 corresponding to the luminous zone, a plurality of first grooves 100 are formed at an area of the pixel defining layer 114 corresponding to the non-luminous zone, and the plurality of first grooves 100 are disposed between the plurality of openings 1141.

In step S440, a first electrode layer and a light emission functioning layer are formed in the plurality of openings; the first electrode layer includes a plurality of first sub-electrodes; and each first sub-electrode is electrically connected with a corresponding thin film transistor of the thin film transistor array substrate.

Figure 15C:
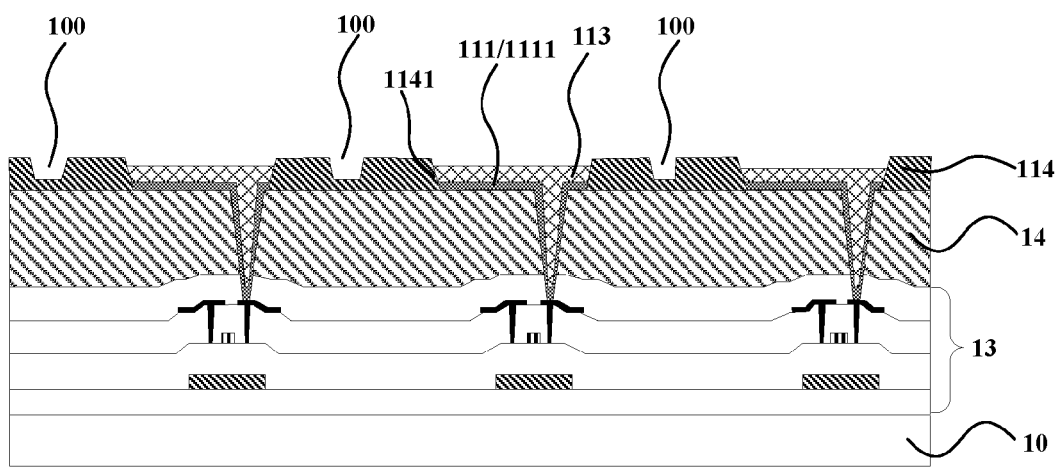
FIG. 15C is a schematic diagram showing the cross-sectional structure in step 440.

FIG. 15C is a schematic diagram showing the cross-sectional structure in step 440. As shown in FIG. 15C, in order to realize the electrical connection between each first sub-electrodes 1111 of the first electrode layer 111 and the corresponding thin film transistor of the thin film transistor array layer 13, it is required to form a plurality of through holes firstly, each of which exposes a source electrode or drain electrode of the corresponding thin film transistor; then the first electrode layer 111 is formed on the planarization layer 14. The first electrode layer 111 includes a plurality of first sub-electrodes 1111, each of which is electrically connected with a corresponding thin film transistor of the thin film transistor array layer 13 via a corresponding through hole.

In step S450, a second electrode layer is formed, and the second electrode layer is a planar electrode.

Figure 15D:
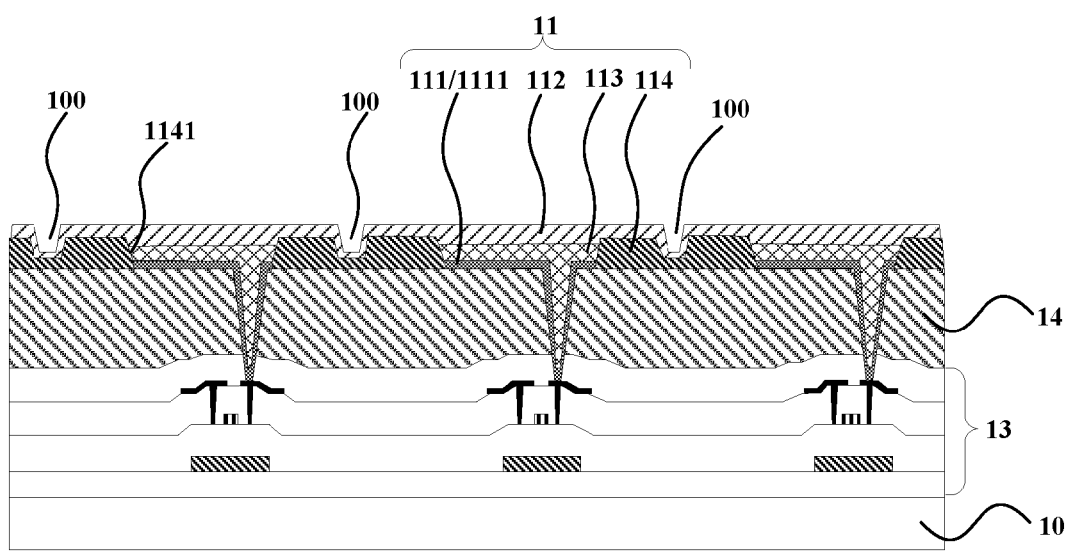
FIG. 15D is a schematic diagram showing the cross-sectional structure in step 450.

FIG. 15D is a schematic diagram showing the cross-sectional structure in step 450. As shown in FIG. 15D, the second electrode layer 112 is formed and the second electrode layer 112 is a planar electrode.

In step S460, an encapsulation layer is formed on the light emitting element layer and the plurality of first grooves, and the plurality of first grooves are filled with the encapsulation layer.

Figure 15E:
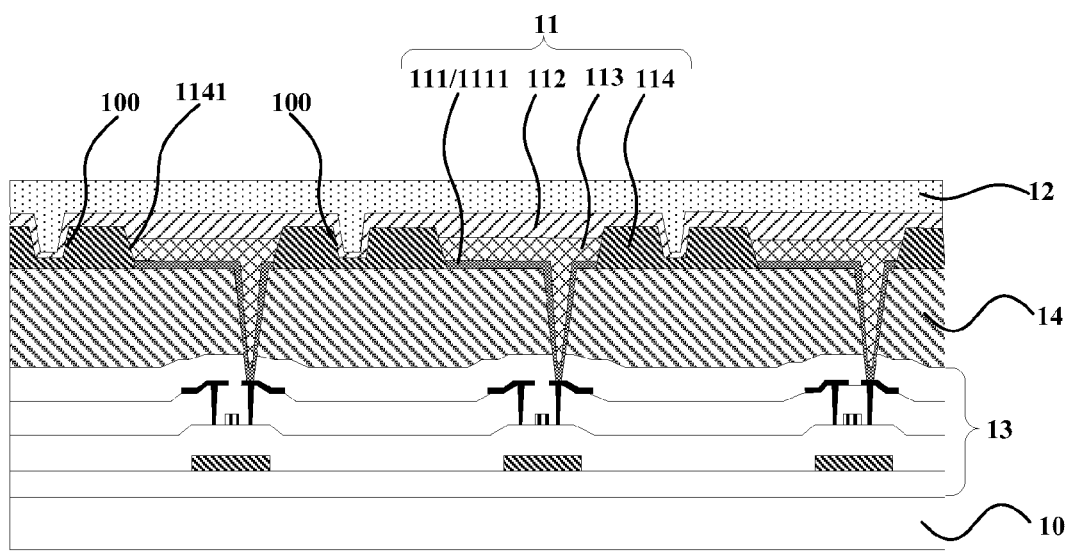
FIG. 15E is a schematic diagram showing the cross-sectional structure in step 460.

FIG. 15E is a schematic diagram showing the cross-sectional structure in step 460. As shown in FIG. 15E, the encapsulation layer 12 is formed on the light emitting element layer 11 and the plurality of first grooves 100, and the plurality of first grooves 100 are filled with the encapsulation layer 12.

Based on the above embodiments, optionally, during forming the plurality of first grooves at an area of the pixel defining layer corresponding to the non-luminous zone, the method further includes:

a plurality of second grooves is formed at the planarization layer. The first groove runs through the pixel defining layer in a direction perpendicular to the substrate; each of the second grooves interfaces with a respective one of the first grooves, and the depth of the second groove is less than or equal to the thickness of the planarization layer, such that the bending stress can be effectively reduced by the organic layer. Note that the first groove and second groove may be formed in a same process. According to the present embodiment, the first groove and second groove make up a filled groove. The cross-sectional structure of the filled groove may be arc-shaped, and the angle α is in a region of 0° to 60°.

Optionally, in the case that the first groove runs through the pixel defining layer in a direction perpendicular to the substrate, the second groove runs through the planarization layer; during forming the plurality of first grooves and the plurality of second grooves at an area of the pixel defining layer corresponding to the non-luminous zone, the method further includes:

A plurality of third grooves are formed on the thin film transistor array layer. Each of the third grooves interfaces with a respective one of the second grooves, the depth of the third groove is less than or equal to the thickness of the thin film transistor array layer. The first, second and third grooves may be formed in a same process. According to the present embodiment, the first, second and third grooves make up a filled groove. The cross-sectional structure of the filled groove may be arc-shaped, and the angle α is in a region of 0° to 60°.

According to embodiments of the present invention, the encapsulation layer may have a one-layer structure or multi-layer structure. The material of the encapsulation layer may be organic material or inorganic material, or a stacked structure of an organic layer and an inorganic layer. For example, the encapsulation layer includes at least one organic layer and at least one inorganic layer. In order to ensure the tightness of the organic light emitting display panel, the light emitting element layer is arranged to contact with an inorganic layer.

Optionally, the step of forming an encapsulation layer on the light emitting element layer and the plurality of first grooves filled with the encapsulation layer, includes:

A first inorganic layer is formed on the light emitting element layer and the plurality of first grooves;

A first organic layer is formed on the first inorganic layer;

A second inorganic layer is formed on the first organic layer.

It should be noted that the embodiments of the disclosure and the technical principles used therein are described as above. It should be appreciated that the disclosure is not limited to the particular embodiments described herein, and any apparent alterations, modification and substitutions can be made without departing from the scope of protection of the disclosure. Accordingly, while the disclosure is described in detail through the above embodiments, the disclosure is not limited to the above embodiments and can further include other additional embodiments without departing from the concept of the disclosure.

What is claimed is:

1. An organic light emitting display panel, comprising:
    a substrate;
    a light emitting element layer disposed on the substrate, wherein the light emitting element layer is provided with a plurality of first grooves; and
    an encapsulation layer disposed on the light emitting element layer, wherein the plurality of first grooves are filled with the encapsulation layer;
    wherein a thin film transistor array layer is disposed between the substrate and the light emitting element layer, and a planarization layer is disposed between the thin film transistor array layer and the light emitting element layer;
    wherein organic light emitting display panel is an active organic light emitting display panel, and the light emitting element layer comprises a first electrode layer, a pixel defining layer, a light emission functioning layer and a second electrode layer;
    wherein orthographic projections of the plurality of first grooves on the substrate are located within an orthographic projection of the pixel defining layer on the substrate;
    wherein each of the plurality of first grooves runs through the pixel defining layer in a direction perpendicular to the substrate;
    wherein the planarization layer is provided with a plurality of second grooves, each of the plurality of second grooves interfacing with a respective one of the plurality of first grooves, and a depth of each of the plurality of second grooves being less than or equal to a thickness of the planarization layer.

2. The organic light emitting display panel of claim 1, wherein
    the organic light emitting display panel comprises a luminous zone and a non-luminous zone;
    a plurality of openings are disposed at an area of the pixel defining layer corresponding to the luminous zone;
    the light emission functioning layer is located in the plurality of openings corresponding to the luminous zone;
    the plurality of first grooves are provided in an area of the pixel defining layer corresponding to the non-luminous zone;
    the first electrode layer comprises a plurality of first sub-electrodes;
    each of the plurality of firs sub-electrodes is electrically connected with a corresponding thin film transistor in the thin film transistor array layer; and
    the second electrode layer is a planar electrode.

3. The organic light emitting display panel of claim 2, wherein
    each of the plurality of second grooves runs through the planarization layer in the direction perpendicular to the substrate;
    the thin film transistor array layer is provided with a plurality of third grooves, each of the plurality of third grooves interfacing with a respective one of the plurality of second grooves, and a depth of each of the plurality of third groove being less than or equal to a thickness of the thin film transistor array layer.

4. The organic light emitting display panel of claim 1, wherein the encapsulation layer comprises at least one inorganic layer and at least one organic layer, and the light emitting element layer contacts with one inorganic layer.

5. The organic light emitting display panel of claim 4, wherein the encapsulation layer comprises a first inorganic layer, a first organic layer and a second inorganic layer sequentially arranged in a direction from the substrate to the light emitting element layer.

6. The organic light emitting display panel of claim 2, wherein the first electrode layer and the second electrode layer both are transparent conductive layers.

7. The organic light emitting display panel of claim 2, wherein the first electrode layer is a metal reflective electrode, and the second electrode is a transparent conductive layer;
    or the first electrode layer is a transparent conductive layer and the second electrode is a metal reflective electrode.

8. The organic light emitting display panel of claim 1, wherein the plurality of the first grooves have arc-shaped sidewalls.

9. The organic light emitting display panel of claim 8, wherein an angel between a tangent of the sidewall of the first groove and a bottom surface of the first groove is in a range between 0 degree to 60 degrees.

10. A method for fabricating an organic light emitting display panel, comprising:
    forming a light emitting element layer on a substrate;
    forming a plurality of first grooves at the light emitting element layer; and
    forming an encapsulation layer on the light emitting element layer, wherein the plurality of first grooves are filled with the encapsulation layer;
    wherein before the forming the light emitting element layer on the substrate, the method further comprises:
    successively forming a thin film transistor array layer and a planarization layer, on the substrate;

wherein the forming the light emitting element layer on the substrate comprises:
sequentially forming a first electrode layer, a light emission functioning layer, and a second electrode layer on the substrate;
forming a first electrode layer on the planarization layer;
forming, on the planarization layer and the first electrode layer, a pixel defining layer;
wherein the method further comprises:
forming a plurality of second grooves at the planarization layer, wherein each of the plurality of first grooves run through the pixel defining layer in a direction perpendicular to the substrate, each of the plurality of second grooves interfacing with a respective one of the plurality of first grooves, and a depth of each of the plurality of second grooves being less than or equal to a thickness of the planarization layer.

11. The method of claim 10, wherein
the first electrode layer comprises a plurality of first sub-electrodes arranged in parallel to each other, and
the second electrode layer comprises a plurality of second sub-electrodes arranged in parallel to each other,
wherein the plurality of first sub-electrodes are insulated from and intersected with the plurality of second sub-electrodes.

12. The method of claim 11, wherein a depth of a given one of plurality of the first grooves is less than a sum of a thickness of the first electrode layer, a thickness of the light emission functioning layer and a thickness of the second electrode layer.

13. The method of claim 10,
wherein the first electrode layer comprises a plurality of first sub-electrodes, each of which is electrically connected with a corresponding thin film transistor of the thin film transistor array layer;
wherein forming a light emitting element layer on a substrate comprises:
forming a plurality of openings at an area of the pixel defining layer corresponding to a luminous zone, wherein the plurality of first grooves are formed in an area of the pixel defining layer corresponding to a non-luminous zone, and wherein the plurality of first grooves are arranged between the plurality of openings;
forming the light emitting element layer in the plurality of openings; and
forming the second electrode layer on the light emitting element layer, wherein the second electrode layer is a planar electrode.

14. The method of claim 10,
wherein forming a light emitting element layer on a substrate comprises:
forming a plurality of openings at an area of the pixel defining layer corresponding to the luminous zone, wherein the plurality of first grooves are formed in an area of the pixel defining layer corresponding to the non-luminous zone, and wherein the plurality of first grooves are arranged between the plurality of openings;
forming, in the plurality of openings, the first electrode layer and the light emitting element layer, wherein the first electrode layer comprises a plurality of first sub-electrodes, each of the plurality of first sub-electrodes being electrically connected with a corresponding thin film transistor of the thin film transistor array layer; and
forming the second electrode layer, wherein the second electrode layer is a planar electrode.

15. The method of claim 13, wherein the plurality of openings and the plurality of first grooves are formed in a same process.

16. An organic light emitting display panel, comprising:
a substrate;
a light emitting element layer disposed on the substrate, wherein the light emitting element layer is provided with a plurality of first grooves; and
an encapsulation layer disposed on the light emitting element layer, wherein the plurality of first grooves are filled with the encapsulation layer;
wherein the organic light emitting display panel is passive organic light emitting display panel, and the light emitting element layer comprises a first electrode layer, a second electrode layer and a light emission functioning layer disposed between the and the first electrode layer and the second electrode layer;
wherein the first electrode layer comprises a plurality of first sub-electrodes arranged in parallel to each other, the second electrode layer comprises a plurality of second sub-electrodes arranged in parallel to each other, and the plurality of first sub-electrodes are insulated from and intersected with the plurality of second sub-electrodes;
wherein vertical projections of the plurality of first grooves on the substrate do not overlap with vertical projections of the plurality of first sub-electrodes and the plurality of second sub-electrodes on the substrate, wherein the light emission functioning layer is provided with the plurality of first grooves or,
wherein vertical projections of the plurality of first grooves on the substrate overlap with vertical projections of intersecting areas of the plurality of first sub-electrodes and the plurality of second sub-electrodes on the substrate, and the plurality of first grooves run though the plurality of second sub-electrodes.

17. The organic light emitting display panel of claim 16, wherein a depth of one of the plurality of the first grooves is less than or equal to a sum of a thickness of the first electrode layer, a thickness of the light emission functioning layer and a thickness of the second electrode layer.

* * * * *